US010848135B1

(12) United States Patent
Sahu et al.

(10) Patent No.: US 10,848,135 B1
(45) Date of Patent: Nov. 24, 2020

(54) RECEIVER DESIGN WITH REDUCED VARIATION

(71) Applicant: Advanced Micro Devices, Inc., Santa Clara, CA (US)

(72) Inventors: Ashish Sahu, Bangalore (IN); Girish Anathahally Singrigowda, Bangalore (IN); Aniket Bharat Waghide, Bangalore (IN); Prasanth K. Vallur, Bangalore (IN)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 16/537,872

(22) Filed: Aug. 12, 2019

(51) Int. Cl.
  *H03K 3/3565* (2006.01)
  *H03K 5/24* (2006.01)

(52) U.S. Cl.
  CPC ......... *H03K 3/3565* (2013.01); *H03K 5/2472* (2013.01)

(58) Field of Classification Search
  CPC .................................................. H03K 3/3565
  See application file for complete search history.

(56) References Cited

U.S. PATENT DOCUMENTS

| 4,539,489 | A | 9/1985 | Vaughn | |
| 6,870,413 | B1 * | 3/2005 | Chang | H03K 3/3565 327/205 |
| 7,764,101 | B2 * | 7/2010 | Wu | H03K 5/082 327/205 |
| 9,806,700 | B2 * | 10/2017 | Iguelmamene | H03K 3/012 |

OTHER PUBLICATIONS

Al-Sarawi, S., "Low Power Schmitt Trigger Circuit," Electronics Letters, vol. 38, No. 18, Aug. 29, 2002, pp. 1009-1010.
Chen, S. and Ker, M., "A New Schmitt Trigger Circuit in a 0.13-μm 1/ 2.5-V CMOS Process to Receive 3.3-V Input Signals," IEEE Transactions on Circuits and Systems-II: Express Briefs, vol. 52, No. 7, Jul. 2005, pp. 361-365.
Di Cataldo, G. and Palumbo, G., "New CMOS Current Schmitt Triggers," IEEE Proceedings of International Symposium on Circuits and Systems, vol. 3, Aug. 2002, pp. 1292-1295.
Dokic, B., "CMOS NAND and NOR Schmitt Circuits," Microelectronics Journal, vol. 27, 1996, pp. 757-765.
Dokic, B., "CMOS Schmitt Trigger with Wide Hysteresis," Microelectronics Journal, vol. 15, No. 2, 1984, pp. 24-29.
Dokic, B., "CMOS Schmitt Triggers," IEE Proceedings, vol. 131, Part G, No. 5, Oct. 1984, pp. 197-202.
(Continued)

*Primary Examiner* — Hai L Nguyen
(74) *Attorney, Agent, or Firm* — Zagorin Cave LLP

(57) ABSTRACT

A receiver circuit holds an output voltage at a first output voltage level using a first device of a first type coupled between a first node and a first power supply node, and a second device of a second type coupled between the first node and the first power supply node. The first device is selectively enabled using an input signal. The second device is selectively enabled using a feedback signal. The second device is substantially larger than the first device. The receiver circuit switches the output voltage from the first output voltage level to a second output voltage level responsive to an input voltage level transitioning across a first threshold voltage level from a first input voltage level to a second input voltage level.

20 Claims, 3 Drawing Sheets

(56) References Cited

OTHER PUBLICATIONS

Filanovsky, M. and Baltes, H., "CMOS Schmitt Trigger Design," IEEE Transactions on Circuits and Systems I: Fundamental Theory and Applications, vol. 41, No. 1, Jan. 1994, pp. 46-49.

Katyal, V., et al., "Adjustable Hysteresis CMOS Schmitt Triggers," IEEE Proceedings of International Symposium on Circuits and Systems, Jun. 2008, pp. 1938-1941.

Kim, D., et al., "A New Waveform-Reshaping Circuit: An Alternative Approach to Schmitt Trigger," IEEE Journal of Solid-State Circuits, vol. 28, No. 2, Feb. 1993, pp. 162-164.

Kuang, J.B. and Chuang, C.T., "PD/SOI CMOS Schmitt Trigger Circuits with Controllable Hysteresis," IEEE Proceedings of International Symposium VLSI Technology, Systems and Applications, 2001, pp. 283-286.

Pedroni, V.A., "Low-Voltage High-Speed Schmitt Trigger and Compact Window Comparator," Electronics Letters, vol. 41, No. 22, Oct. 27, 2005, 2 pages.

Pfister, A., "Novel CMOS Schmitt Trigger with Controllable Hysteresis," Electronic Letters, vol. 28, No. 7, Mar. 1992, pp. 639-641.

Sapawi, R., et al., "Performance of CMOS Schmitt Trigger," Proceedings of the International Conference on Computer and Communication Engineering, May 2008, pp. 1317-1320.

Wang, Z., "CMOS Adjustable Schmitt Trigger," IEEE Transactions on Instrumentation and Measurement, vol. 40, No. 3, Jun. 1991, pp. 601-605.

Yuan, F., "Current Regenerative Schmitt Triggers with Tunable Hysteresis," IEEE Proceedings of International Midwest Conference on Circuits and Systems, Sep. 2009, pp. 110-113.

Baker, R. J., et al., "CMOS Circuit Design, Layout, and Simulation," Aug. 1, 1997, Chapter 18.1, pp. 355-372, IEEE Press Series on Microelectronic Systems, The Institute of Electrical and Electronics Engineers, Inc., New York.

Sedra, A. And Smith, K., "Microelectronic Circuits," 5th Edition, 2004, pp. 235-359, pp. 545-665, Appendix B and C, Oxford University Press, New York.

\* cited by examiner

RECEIVER DESIGN WITH REDUCED VARIATION

BACKGROUND

Description of the Related Art

In general, signals communicated between devices on a printed circuit board using conductive traces or transmission lines are distorted by noise before the signals enter a receiving device. In addition, signal quality decreases when ground bounce and supply bounce cause logic high signals and logic low signals to be a damped sinusoid. Interfaces of analog or digital systems use a Schmitt trigger circuit to convert a noisy received signal with slow or asymmetrical transitions into a signal with a sharp transition region. A Schmitt trigger circuit is a regenerative circuit that incorporates positive feedback. When an input voltage ($V_{IN}$) is greater than a first threshold voltage level ($V_{IH}$), the Schmitt trigger circuit outputs a high voltage signal. When the input voltage is lower than a second threshold voltage level ($V_{IL}$), the Schmitt trigger circuit outputs a low voltage signal. When the input voltage is between the first and second threshold voltage levels ($V_{IL}<V_{IN}<V_{IH}$), the output retains its state. The difference between the first threshold voltage level and the second threshold voltage level is selected to cause a change to the output voltage level only in response to a sufficient change in the input voltage level. This dual threshold action is called hysteresis and the hysteresis voltage ($V_{HYS}$) is defined as the difference between the higher threshold voltage level and the lower threshold voltage level ($V_{HYS}=V_{IH}-V_{IL}$). Hysteresis increases immunity to noise by effectively raising a threshold voltage or switch point when a low voltage signal is present on the output and lowers the threshold voltage when a high voltage signal is present on the output.

A conventional Schmitt trigger circuit that is implemented using an operational amplifier with resistive positive feedback suffers from high power consumption. Variations in manufacturing process and temperature directly affect the first threshold voltage and the second threshold voltage. Thus, the conventional Schmitt trigger circuit do not maintain constant switching voltage thresholds at low supply voltages. In low power applications, interface circuits should be capable of receiving high voltage signals from external sources, but lower internal supply voltages are used to reduce power consumption. As power supply voltage levels decrease, the noise margins of conventional Schmitt trigger circuits decrease and may not satisfy specifications for target applications. Other conventional Schmitt trigger circuits (e.g., current regenerative Schmitt triggers and single-ended Schmitt trigger circuits) require additional bias voltages to control the hysteresis and consume static power making those Schmitt triggers unattractive solutions for low-voltage, ultra-low-power digital interface devices. Accordingly, an improved receiver interface is desired.

SUMMARY OF EMBODIMENTS OF THE INVENTION

In at least one embodiment, a method for operating a receiver circuit includes receiving an input signal having an input voltage level. The method includes maintaining an output voltage at a first output voltage level using a first device of a first type coupled between a first node and a first power supply node and using a second device of a second type coupled between the first node and the first power supply node. The first device is selectively enabled using the input signal. The second device is selectively enabled using a feedback signal. The second device is substantially larger than the first device. The method includes switching the output voltage from the first output voltage level to a second output voltage level responsive to the input voltage level transitioning across a first threshold voltage level from a first input voltage level to a second input voltage level. The switching uses a third device of the second type coupled between the first node and a second power supply node and selectively enabled based on the input signal. The switching uses a fourth device of the second type coupled between the first node and the second power supply node and selectively enabled based on the feedback signal.

In at least one embodiment, a circuit includes an input terminal configured to receive an input signal. The receiver circuit includes a first circuit including a first device having a first type coupled between a first power supply node and a first node and responsive to the input signal. The first circuit includes a second device having a second type coupled between a second power supply node and the first node and responsive to the input signal. The receiver circuit includes a second circuit coupled between the first power supply node and the second power supply node. The second circuit is configured to generate a feedback signal on a feedback node based on a signal on the first node. The receiver circuit includes a third circuit coupled between the first power supply node and the second power supply node and coupled between the feedback node and the first node. The third circuit includes a third device having the second type coupled to the feedback node and coupled between the first power supply node and the first node. The third device is substantially larger than the first device. The third circuit includes a fourth device having the first type coupled to the feedback node and coupled between the second power supply node and the first node. The fourth device is substantially larger than the second device.

In at least one embodiment, a method includes generating an output signal in response to an input signal using a hysteretic comparator having an upper trigger voltage level ($V_{IH}$), a lower trigger voltage level ($V_{IL}$), and a hysteresis voltage level ($V_{HYS}$). The hysteretic comparator switches the output signal from a first output voltage level to a second output voltage level using a first circuit and a feedback circuit. The first circuit enables first devices that overcome a second device enabled in the feedback circuit. The first devices and the second device have the same transistor type. The second device has a first size that is larger than a second size of each device of the first devices.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
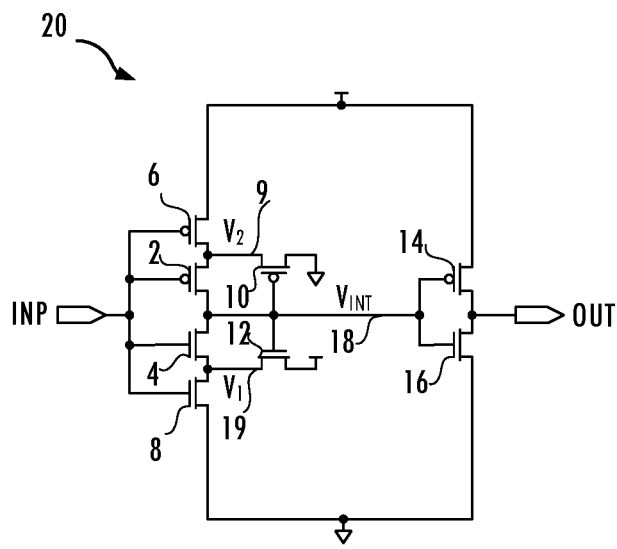
FIG. 1 illustrates a circuit diagram of a conventional Schmitt trigger circuit.
Figure 2:
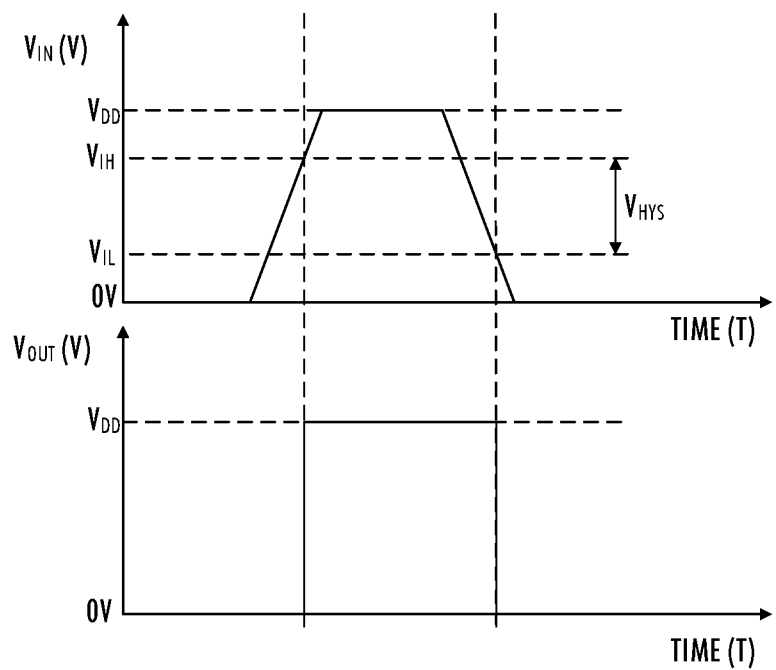
FIG. 2 illustrates waveforms for signals of the conventional Schmitt trigger circuit of FIG. 1.

FIGS. 1 and 2 illustrate a circuit diagram of a conventional Schmitt trigger circuit and associated signal waveforms. P-type transistor 2 and n-type transistor 4 form a standard CMOS inverter. P-type transistor 6 and p-type transistor 10, and n-type transistor 8 and n-type transistor 12 form a feedback network and operate as an inverting p-type (i.e., PMOS) amplifier and operate as an inverting n-type (i.e., NMOS) amplifier. P-type transistor 14 and n-type transistor 16 form a standard CMOS inverter coupled to an output terminal. In at least one embodiment of Schmitt trigger circuit 20, the threshold voltages of the n-type transistors and the p-type transistors are $V_{TN}$ and $V_{TP}$, respectively. When input voltage $V_{IN}$ at input terminal INP is 0 V, p-type transistor 6 and p-type transistor 2 are on, with negligible drain current, since n-type transistor 4 and n-type transistor 8 are off. The internal voltage $V_{INT}$ on node 18 is approximately $V_{DD}$ and output voltage $V_{OUT}$ at output terminal OUT is approximately 0 V. P-type transistor 10 is off, n-type transistor 12 is at the threshold of conduction, and voltage $V_1$ on node 19 is approximately $V_{DD}-V_{TN}$. When input voltage $V_{IN}$ rises to n-type transistor threshold voltage $V_{TN}$, n-type transistor 8 begins turning on, but n-type transistor 4 is off because voltage $V_1$ is greater than transistor threshold voltage $V_{TN}$. N-type transistor 8 and n-type transistor 12 are in the saturation region of operation and form an inverting n-type amplifier. The gain of this inverting amplifier depends on the relative strengths of n-type transistor 12 and n-type transistor 8. As input voltage $V_{IN}$ rises, voltage $V_1$ falls. When input voltage $V_{IN}$ equals $V_1+V_{TN}$, n-type transistor 4 turns on. When p-type transistor 6, p-type transistor 2, n-type transistor 4, and n-type transistor 8 are in the saturation region of operation, regenerative switching is about to take over and $V_{INT}$ rapidly falls to 0 V, turning off n-type transistor 12 and turning on p-type transistor 10. With voltage $V_{INT}$ falling to 0 V, p-type transistor 14 turns on, and n-type transistor 16 turns off, causing output voltage $V_{OUT}$ at output terminal OUT to transition to a high voltage level. The input voltage at which these changes occur is the higher threshold voltage level $V_{IH}$ of Schmitt trigger circuit 20.

When input voltage $V_{IN}$ at input terminal INP falls from $V_{DD}$ to 0 V, and when input voltage $V_{IN}$ equals $V_{DD}$, p-type transistor 6, p-type transistor 2 and n-type transistor 12 are off, n-type transistor 4, n-type transistor 8 are on, and p-type transistor 10 is at a threshold of conduction. That is voltage $V_{INT}$ on node 18 equals approximately 0 V and voltage $V_2$ on node 9 is $|V_{TP}|$. The p-type transistor 2 turns on at $V_{IN}=V_{DD}+V_{TP}$. Since p-type transistor 6 and p-type transistor 10 are saturated, voltage $V_2$ increases linearly as input voltage $V_{IN}$ decreases. At $V_{IN}=V_2+V_{TP}$, p-type transistor 2 turns on. When p-type transistor 6, p-type transistor 2, n-type transistor 4, and n-type transistor 8 transistors are in saturation, the regenerative process occurs and $V_{INT}$ rapidly goes to $V_{DD}$, turning off p-type transistor 10 and turning on n-type transistor 12. With the rise in voltage $V_{INT}$ to $V_{DD}$, p-type transistor 14 turns off and n-type transistor 16 turns on, causing output voltage $V_{OUT}$ at output terminal OUT to transition to 0 V. Then the input voltage is approximately equal to the lower threshold voltage level $V_{IL}$. The higher threshold voltage level $V_{IH}$ and the lower threshold voltage level $V_{IL}$ depend on device dimensions, supply voltage, temperature, the ratio of transistor current gain constants (β), and the threshold voltages of n-type transistors and p-type transistors ($V_{TN}$ and $V_{TP}$, respectively). Ideally, if $β_P/β_N$ and $V_{TP}/V_{TN}$ remain constant across process and temperature then higher threshold voltage level $V_{IH}$ and lower threshold voltage level $V_{IL}$ move in the same direction and the hysteresis voltage level $V_{HYS}$ remains constant. However, in practice, device characteristics of p-type transistors and n-type transistors vary in opposing directions, e.g., in one process corner an n-type transistor can be slower than a typical process condition and a p-type transistor can be faster than a typical process condition, and vice versa. Since the device characteristics of n-type transistors and p-type transistors vary in opposite directions, the ratio of transistor β constants and the ratio of transistor threshold voltages vary at different process corners and temperatures causing higher threshold voltage level $V_{IH}$ and lower threshold voltage level $V_{IL}$ to move in opposite directions resulting in a wide variation of lower threshold voltage level $V_{IL}$, higher threshold voltage level $V_{IH}$, and hysteresis voltage level $V_{HYS}$.

Figure 3:
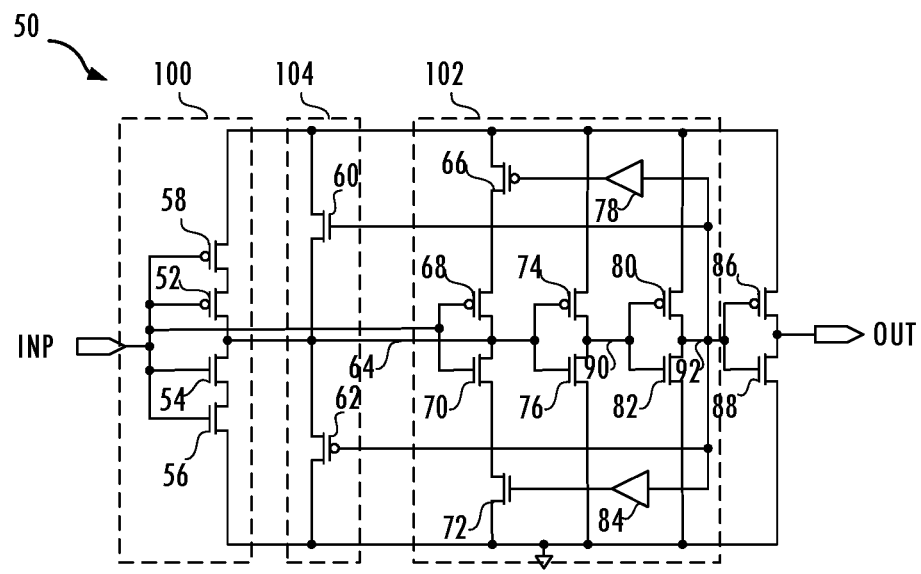
FIG. 3 illustrates a circuit diagram of a hysteretic receiver circuit consistent with at least one embodiment of the invention.

FIG. 3 illustrates a circuit diagram of hysteretic receiver circuit 50 that has higher threshold voltage level $V_{IH}$ and lower threshold voltage level $V_{IL}$ that have reduced dependency on device dimensions, temperature, the ratio of transistor β constants and threshold voltage of transistors ($V_{TN}$ and $V_{TP}$), and improving noise immunity of hysteretic receiver circuit 50 as compared to a conventional Schmitt trigger circuit. An embodiment of hysteretic receiver circuit 50 includes first circuit 100, second circuit 102, and third circuit 104. Second circuit 102 generates a feedback signal that is used by third circuit 104 to ensure that the contention for rising edges of an internal signal and contention for falling edges of the internal signal occur between devices of the same transistor type (e.g., p-type or n-type), thus reducing the effects of process or temperature variation. Hysteretic receiver circuit 50 meets target specifications with greater margins and does not require an additional compensation circuit or reference/bias voltage.

In an initial state of hysteretic receiver circuit 50, input voltage $V_{IN}$ at input terminal INP has a low voltage (e.g., 0 V). P-type transistors 52 and 58 are enabled, N-type transistors 60 and 72 are enabled. P-type transistor 66 is disabled. Since n-type transistors 54, 56, and 70, and p-type transistor 62 are disabled, there is no pull-down path for node 64. Hence, p-type transistors 52 and 58, and n-type transistor 60 pull up the voltage on node 64 to approximately $V_{DD}$. The inverting amplifier formed by p-type transistor 74 and n-type transistor 76 drive the voltage on node 90 to approximately 0 V and the inverting amplifier formed by p-type transistor 80 and n-type transistor 82 drive the voltage on node 92 to approximately $V_{DD}$. The inverting amplifier formed by p-type transistor 86 and n-type transistor 88 drive output voltage $V_{OUT}$ at output terminal OUT to a low voltage value (e.g., approximately 0 V). Node 92 is a feedback path to n-type transistor 60 and n-type transistor 72 and maintains n-type transistor 60 and n-type transistor 72 in an enabled (i.e., on) state. In an embodiment of hysteretic receiver circuit 50, the size (e.g., W/L) of n-type transistor 60 is substantially larger (e.g., approximately ten times larger) than that of p-type transistor 52 and p-type transistor 58. Hence, the contribution (e.g., strength) of current due to n-type transistor 60 is substantially greater (e.g., almost ten times greater) than the contribution of current through p-type transistor 52 and p-type transistor 58. Thus, n-type transistor 60 acts as a strong pull-up circuit for node 64. Meanwhile, a contribution of the pull-up circuit including p-type transistor 52 and p-type transistor 58 plays a negligible role in switching node voltages as compared to the contribution of the pull-up circuit including n-type transistor 60.

Figure 4:
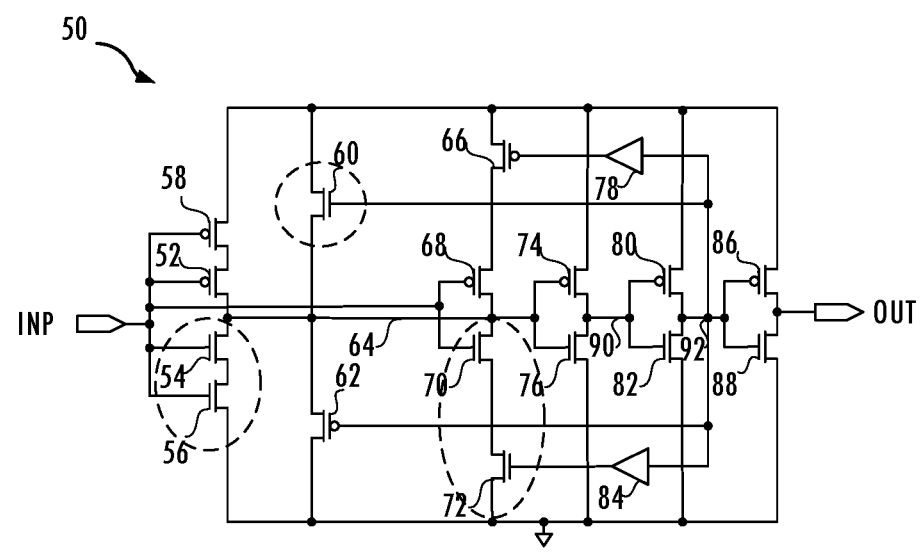
FIG. 4 illustrates a circuit diagram of the hysteretic receiver circuit of FIG. 3 with identification of enabled devices responsive to the input signal having a voltage level rising from 0 V to $V_{DD}$ consistent with at least one embodiment of the invention.

As input voltage $V_{IN}$ at input terminal INP rises from 0 V to $V_{DD}$, n-type transistor 54, n-type transistor 56, and n-type transistor 70 turn on and become stronger as their gate-to-source voltages ($V_{GS}$) also increase with increases in input voltage $V_{IN}$. The increased drive strength of n-type transistors causes the pull-down contributions of the n-type transistor 54, n-type transistor 56, n-type transistor 70, and n-type transistor 72 to be stronger than the pull-up contributions of p-type transistor 52, p-type transistor 58, and n-type transistor 60. Node 64 discharges to 0 V causing node 90 to charge up to $V_{DD}$ and node 92 to be pulled down to 0 V, causing switching at higher threshold voltage level $V_{IH}$. This switching occurs because the pull-down of n-type transistor 54, n-type transistor 56, n-type transistor 70, n-type transistor 72 overcome the pull-up of n-type transistor 60. The n-type transistors circled in FIG. 4 are substantially responsible for the switching and p-type transistors provide only negligible contributions. The device parameters of the n-type transistors will be similarly affected by the process, and temperature variation. This relationship across process and temperature, between n-type pull-up and n-type pull-down devices decreases variation in higher threshold voltage level $V_{IH}$ and hysteresis voltage level $V_{HYS}$ as compared to pull-up circuits and pull-down circuits having substantial contributions from both n-type and p-type transistors.

When the switching occurs, the voltage on node 92 transitions to approximately 0 V, which turns off the strong pull-up of n-type transistor 60. To ensure that the gate voltages of n-type transistor 54 and n-type transistor 56 are sufficient to hold the node 64 at 0 V, the feedback path includes a buffer delay that maintains n-type transistor 72 in an enabled state until n-type transistor 54 and n-type transistor 56 are strong enough to hold node 64 at a low voltage of approximately 0 V after n-type transistor 72 is turned off. The voltage on node 92 turns on p-type transistor 62, keeping node 64 at a low voltage of approximately 0 V. After the delay provided by buffer 84, n-type transistor 72 turns off and node 64 is now strongly pulled down by p-type transistor 62, and n-type transistors 54 and 56. Output voltage $V_{OUT}$ at output terminal OUT switches to a high voltage level after input voltage $V_{IN}$ at input terminal INP crosses higher threshold voltage level $V_{IH}$.

Figure 5:
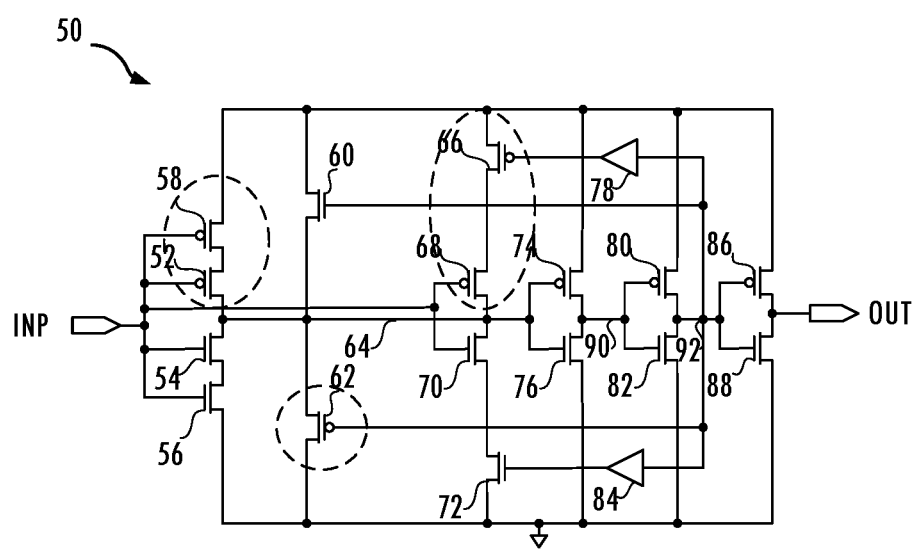
FIG. 5 illustrates a circuit diagram of the hysteretic receiver circuit of FIG. 3 with identification of enabled devices responsive to the input signal having a voltage level falling from $V_{DD}$ to 0 V consistent with at least one embodiment of the invention.

Referring to FIG. 5, when input voltage $V_{IN}$ at input terminal INP is high, ($V_{IN}$ is approximately $V_{DD}$), n-type transistor 54, n-type transistor 56, and p-type transistor 62 are enabled. Hence the voltage on node 64 is approximately 0 V, the voltage on node 90 is approximately $V_{DD}$, the voltage on node 92 is approximately 0 V, and output voltage $V_{OUT}$ at output terminal OUT is a high voltage level (e.g., approximately $V_{DD}$). Node 92 provides feedback to p-type transistors 62 and 66 and maintains p-type transistors 62 and 66 in an enabled state. In at least one embodiment of hysteretic receiver circuit 50, the size of p-type transistor 62 is substantially larger (e.g., approximately ten times larger) than the size of n-type transistor 56, and n-type transistor 54. The contribution of current through p-type transistor 62 is substantially greater than (e.g., almost ten times greater than) the current contribution of n-type transistor 56 and n-type transistor 54. Thus, p-type transistor 62 behaves as a strong pull-down circuit for node 64. Meanwhile a contribution of the pull-down circuit including n-type transistor 54 and n-type transistor 56 plays a negligible role in switching node voltages as compared to the contribution of the pull-down circuit including p-type transistor 62.

As input voltage $V_{IN}$ at input terminal INP falls from $V_{DD}$ to 0 V, p-type transistor 58, p-type transistor 52, and p-type transistor 68 turn on and become stronger as the associated gate-to-source voltages increase with decreasing input voltage $V_{IN}$. The increased drive strength of p-type transistor 52, p-type transistor 58, p-type transistor 68, and p-type transistor 66, causes these transistors to overcome the pull-down circuit including n-type transistor 54, n-type transistor 56, and p-type transistor 62. Node 64 charges to $V_{DD}$, switching at lower threshold voltage level $V_{IL}$. Node 90 is discharged to approximately 0 V, and node 92 is charged up to approximately $V_{DD}$. This switching occurs because the pull-up circuit including p-type transistor 52, p-type transistor 58, p-type transistor 68, and p-type transistor 66 overcome the pull-down circuit including p-type transistor 62. P-type transistors circled in FIG. 5 are responsible for the switching and n-type transistors provide only negligible contributions. The p-type transistor device parameters will be similarly affected by variations in process and temperature. This relationship across process and temperature, between p-type pull-up and p-type pull-down devices reduces variation in the threshold voltage levels as compared to pull-up circuits and pull-down circuits having substantial contributions from both n-type and p-type transistors.

The voltage switching causes node 92 to charge to approximately $V_{DD}$, which turns-off p-type transistor 62. To ensure that p-type transistor 52 and p-type transistor 58 have gate voltage levels that are sufficient to ensure that these transistors are enabled enough to maintain node 64 at $V_{DD}$, buffer 78 adds a delay to the feedback path. Buffer 78 maintains p-type transistor 66 in an enabled state until p-type transistor 52 and p-type transistor 58 are sufficiently enabled to maintain node 64 at $V_{DD}$ after p-type transistor 66 is turned off. The voltage on feedback node 92 turns on n-type transistor 60, which maintains node 64 at a voltage of approximately $V_{DD}$. After that delay, buffer 78 turns off p-type transistor 66 and the node 64 is now strongly pulled up by n-type transistor 60, p-type transistor 52, and p-type transistor 58. Output voltage $V_{OUT}$ at output terminal OUT switches to a low voltage level after input voltage $V_{IN}$ at input terminal INP crosses lower threshold voltage $V_{IL}$.

Thus, hysteretic receiver circuit 50 has higher threshold voltage level $V_{IH}$ and lower threshold voltage level $V_{IL}$ with substantially reduced variation due to process and temperature variation as compared to a conventional Schmitt trigger circuit experiencing the same process and temperature variations. A feedback path ensures that during switching of internal nodes, contention for rising edges and falling edges occurs between devices having similar types (p-type or n-type), which reduces the effects of process variations on performance of hysteretic receiver circuit 50. Hysteretic receiver circuit 50 achieves these benefits without an additional compensation circuit, without reference/bias voltages, and without significant power consumption. Exemplary applications of hysteretic receiver circuit 50 include detecting small variations in bus voltages by rejecting noise in input/output interfaces and level detection in analog or mixed-signal systems. The reduced variation makes hysteretic receiver circuit 50 more likely to satisfy target threshold specifications in low-power applications than conventional Schmitt trigger circuits. Since hysteretic receiver circuit 50 has reduced variation of the threshold voltages, embodiments of hysteretic receiver circuit 50 meet target design specifications with increased margin thereby improving design yield. Also, reduced variation of the threshold voltages allows embodiments of hysteretic receiver circuit 50 to be used for wide supply voltage ranges.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. For example, while the invention has been described in an embodiment in which individual transistors with a target size relationship are illustrated, one of skill in the art will appreciate that the teachings herein can be utilized with multiple transistors of the same type coupled in parallel to achieve a target transistor size relationship. In addition, while the invention has been described in an embodiment in which transistors having a standard gate oxide thickness are described, one of skill in the art will appreciate that the teachings herein can be utilized with at least some thick oxide transistors (i.e., transistors having higher breakdown voltages than conventional transistors for a particular manufacturing process) that can safely sustain any overshoots and undershoots of input voltage levels or other high voltage levels that are presented to a receiver input. For example, in an embodiment of hysteretic receiver circuit 50, p-type transistors 52, 58, and 68, and n-type transistors 54, 56, and 70 are thick oxide transistors that are directly or indirectly coupled to a pad of an integrated circuit device.

The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A method for operating a receiver circuit comprising:
receiving an input signal having an input voltage level;
maintaining an output voltage at a first output voltage level using a first device of a first type coupled between a first node and a first power supply node, and using a second device of a second type coupled between the first node and the first power supply node, the first device being selectively enabled using the input signal, the second device being selectively enabled using a feedback signal, wherein the second device is substantially larger than the first device; and
switching the output voltage from the first output voltage level to a second output voltage level responsive to the input voltage level transitioning across a first threshold voltage level from a first input voltage level to a second input voltage level, using a third device of the second type coupled between the first node and a second power supply node and selectively enabled based on the input signal, and using a fourth device of the second type coupled between the first node and the second power supply node and selectively enabled based on the feedback signal.

2. The method, as recited in claim 1, wherein a first current through the first device is substantially less than a second current through the second device and the switching includes overcoming the second current using a third current through the third device and a fourth current through the fourth device.

3. The method, as recited in claim 1, further comprising:
maintaining the output voltage at the second output voltage level using the third device and a fifth device of the first type coupled between the first node and the second power supply node, wherein the fifth device is substantially larger than the fourth device; and
switching the output voltage from the second output voltage level to the first output voltage level responsive to the input voltage level transitioning across a second threshold voltage level from the second input voltage level to the first input voltage level, using the first device and using a sixth device of the first type coupled between the first node and the first power supply node and selectively enabled based on the feedback signal,
wherein the first threshold voltage level is greater than the second threshold voltage level.

4. The method, as recited in claim 3, wherein a first current through the third device is substantially less than a second current through the fifth device and the switching includes overcoming the second current using a third current through the first device and a fourth current through the sixth device.

5. The method, as recited in claim 3, further comprising:
delaying the feedback signal used to selectively enable the fourth device; and
delaying the feedback signal used to selectively enable the sixth device.

6. The method, as recited in claim 1, further comprising:
generating the feedback signal based on a signal on the first node; and
generating an output signal having the output voltage based on the feedback signal.

7. The method, as recited in claim 1, wherein the second device is approximately an order of magnitude larger than the first device.

8. The method, as recited in claim 1, wherein the first device is a p-type transistor coupled to the first power supply node and the second device is an n-type transistor coupled to the first power supply node.

9. A receiver circuit comprising:
an input terminal configured to receive an input signal;
a first circuit comprising:
a first device having a first type coupled between a first power supply node and a first node and responsive to the input signal; and
a second device having a second type coupled between a second power supply node and the first node and responsive to the input signal;

a second circuit coupled between the first power supply node and the second power supply node and configured to generate a feedback signal on a feedback node based on a signal on the first node; and a third circuit coupled between the first power supply node and the second power supply node and coupled between the feedback node and the first node, the third circuit comprising:

a third device having the second type coupled to the feedback node and coupled between the first power supply node and the first node, the third device being substantially larger than the first device; and a fourth device having the first type coupled to the feedback node and coupled between the second power supply node and the first node, the fourth device being substantially larger than the second device.

10. The receiver circuit, as recited in claim 9, wherein the first device is a p-type transistor coupled to the first power supply node and the third device is an n-type transistor coupled to the first power supply node.

11. The receiver circuit, as recited in claim 9, wherein a first size of the third device is approximately an order of magnitude larger than a second size of the first device.

12. The receiver circuit, as recited in claim 9, further comprising:

an output terminal configured to provide an output signal based on the feedback signal, a voltage of the output signal changing from a first voltage level to a second voltage level responsive to the input signal exceeding a first threshold voltage level, and the voltage of the output signal changing from the second voltage level to the first voltage level responsive to the input signal falling below a second threshold voltage level, the first threshold voltage level being greater than the second threshold voltage level.

13. The receiver circuit, as recited in claim 12, further comprising:

an output circuit coupled between the first power supply node and the second power supply node and configured to generate the output signal based on the feedback signal.

14. The receiver circuit, as recited in claim 13, wherein the second circuit comprises a fifth device of the second type coupled between the first node and the second power supply node, and wherein the second device and the fifth device are configured to switch an output voltage on the output terminal from a first output voltage level to a second output voltage level responsive to transitioning of the input signal across the first threshold voltage level from a first input voltage level to a second input voltage level.

15. The receiver circuit, as recited in claim 14, wherein the second circuit further comprises a sixth device of the first type coupled between the first node and the first power supply node, and wherein the first device and the sixth device are configured to switch the output voltage from the second output voltage level to the first output voltage level responsive to transitioning of the input signal across the second threshold voltage level from the second input voltage level to the first input voltage level, the first threshold voltage level being greater than the second threshold voltage level.

16. The receiver circuit, as recited in claim 15, wherein the second circuit further comprises:

a delay circuit coupled between the feedback node and the fifth device, wherein the sixth device is selectively enabled by the input signal and coupled between the fifth device and the first node, wherein the sixth device is configured to be enabled until the second device is sufficiently enabled to hold the first node at a voltage level of the second power supply node after the fifth device is disabled.

17. The receiver circuit, as recited in claim 16, wherein the second device, the fifth device, and the sixth device are configured to overcome the first device and the third device to switch the output voltage on the output terminal from the first output voltage level to the second output voltage level responsive to the input signal transitioning across the first threshold voltage level from the first input voltage level to the second input voltage level.

18. A method comprising:

generating an output signal in response to an input signal using a hysteretic comparator having an upper trigger voltage level ($V_{IH}$), a lower trigger voltage level ($V_{IL}$), and a hysteresis voltage level ($V_{HYS}$), wherein the hysteretic comparator switches the output signal from a first output voltage level to a second output voltage level using a first circuit and a feedback circuit, the first circuit enabling first devices that overcome a second device enabled in the feedback circuit, the first devices and the second device having the same transistor type, the second device having a first size larger than a second size of each device of the first devices.

19. The method, as recited in claim 18, wherein the first devices and the second device are n-type transistors.

20. The method, as recited in claim 18, wherein the first size is approximately an order of magnitude larger than the second size.

* * * * *